United States Patent
Wang et al.

(10) Patent No.: US 11,589,469 B2
(45) Date of Patent: Feb. 21, 2023

(54) ELECTRONIC DEVICE AND FASTENING STRUCTURE THEREOF

(71) Applicant: Wistron NeWeb Corp., Hsinchu (TW)

(72) Inventors: Chun-Wei Wang, Hsinchu (TW); Che-Min Lin, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 17/500,257

(22) Filed: Oct. 13, 2021

(65) Prior Publication Data

US 2022/0312605 A1 Sep. 29, 2022

(30) Foreign Application Priority Data

Mar. 26, 2021 (TW) .................................. 110111081

(51) Int. Cl.
*H05K 7/14* (2006.01)
*H05K 5/02* (2006.01)

(52) U.S. Cl.
CPC ......... *H05K 5/0217* (2013.01); *H05K 7/1407* (2013.01)

(58) Field of Classification Search
CPC .................................................. H05K 7/1407
See application file for complete search history.

(56) References Cited

U.S. PATENT DOCUMENTS

| 5,746,609 | A | * | 5/1998 | Franks, Jr. | ............... | H01R 4/66 |
| | | | | | | 439/803 |
| 6,147,305 | A | * | 11/2000 | Honma | ................... | H02G 3/081 |
| | | | | | | 174/58 |
| 6,760,231 | B2 | | 7/2004 | Hung et al. | | |
| 2022/0039722 | A1 | * | 2/2022 | Abercrombie, II | .. | H05K 5/0026 |
| 2022/0201878 | A1 | * | 6/2022 | Kitagawa | ............. | H05K 5/0213 |

FOREIGN PATENT DOCUMENTS

TW 530902 U 5/2003

* cited by examiner

*Primary Examiner* — Hung V Ngo
(74) *Attorney, Agent, or Firm* — McClure, Qualey & Rodack, LLP (57) ABSTRACT

An electronic device is provided. The electronic device includes a housing, a fastened object, a fastener, and a base member. The housing includes a housing body and a bracket. The bracket is integrally formed on the housing body. The bracket includes a bracket stage, a bracket hole and a bracket recess. The bracket hole is formed on the bracket stage. The fastened object corresponds to the bracket stage. At least a portion of the base member is moveably inserted into the bracket recess. The base member includes a member fastening hole. The fastener passes through the fastened object and the bracket hole to connect to the member fastening hole of the base member.

20 Claims, 7 Drawing Sheets

ELECTRONIC DEVICE AND FASTENING STRUCTURE THEREOF

CROSS REFERENCE TO RELATED APPLICATIONS

This Application claims priority of Taiwan Patent Application No. 110111081, filed on Mar. 26, 2021, the entirety of which is incorporated by reference herein.

BACKGROUND OF THE INVENTION

Field of the Invention

The present invention relates to an electronic device, and in particular to an electronic device with a fastening structure.

Description of the Related Art

In a conventional electronic device (such as wireless router), a thread hole is formed on the interior of a housing. A bolt is connected to the thread hole to affix a fastened object (such as circuit board) to the inner side of the housing. The housing is made by injection molding. When the bolt is connected to the thread hole, the bolt applies stress to the housing (the portion around the thread hole). When the electronic device receives an unexpected impact, the portion of the housing around the thread hole may be shattered and broken.

BRIEF SUMMARY OF THE INVENTION

Embodiments of the invention are provided to address the aforementioned difficulty.

In one embodiment, an electronic device is provided. The electronic device includes a housing, a fastened object, a fastener, and a base member. The housing includes a housing body and a bracket. The bracket is integrally formed on the housing body. The bracket comprises a bracket stage, a bracket hole, and a bracket recess. The bracket hole is formed on the bracket stage. The fastened object corresponds to the bracket stage. At least a portion of the base member is moveably inserted into the bracket recess. The base member comprises a member fastening hole. The fastener passes through the fastened object and the bracket hole to connect to the member fastening hole of the base member.

In one embodiment, the fastener is a bolt.

In one embodiment, the environmental stress cracking resistance of the material of the base member is greater than the environmental stress cracking resistance of the material of the bracket.

In one embodiment, the bracket comprises a bracket wedging portion. The base member comprises a member wedging portion. The bracket wedging portion is adapted to be wedged into the member wedging portion.

In one embodiment, the bracket comprises a first sidewall and a second sidewall. One end of the first sidewall is connected to the housing body, and the other end of the first sidewall is connected to the bracket stage. One end of the second sidewall is connected to the housing body, and the other end of the second sidewall is connected to the bracket stage. The bracket recess is formed between the first sidewall and the second sidewall.

In one embodiment, the bracket comprises a first bracket wedging portion and a second bracket wedging portion. The first bracket wedging portion is formed on the first outer surface of the first sidewall, and the second bracket wedging portion is formed on the second outer surface of the second sidewall. The base member comprises a first member wedging portion and a second member wedging portion. The first member wedging portion is wedged into the first bracket wedging portion. The second member wedging portion is wedged into the second bracket wedging portion.

In one embodiment, the base member comprises a member body, a first arm and a second arm. The first arm is formed on one side of the member body, and the second arm is formed on another side of the member body. The first member wedging portion is formed on the free end of the first arm, and the second member wedging portion is formed on the free end of the second arm. The member fastening hole is formed on the member body.

In one embodiment, the member body is inserted into the bracket recess, a portion of the first sidewall is located between the first arm and the member body, and a portion of the second sidewall is located between the second arm and the member body.

In one embodiment, the first bracket wedging portion and the second bracket wedging portion are wedging slots. The first bracket wedging portion and the second bracket wedging portion extend in the first direction. The fastener passes through the fastened object and the bracket hole in the first direction to connect to the member fastening hole of the base member. The first member wedging portion and the second member wedging portion are wedging protrusions.

In one embodiment, the base member comprises a metal nut, which is embedded in the member body. The member fastening hole is formed in the metal nut.

In one embodiment, the fastened object is a circuit board, and the fastened object abuts the bracket stage.

In one embodiment, the electronic device further comprises at least one restriction element. The housing body comprises a housing sidewall. The restriction element is disposed on the edge of the circuit board and the housing sidewall.

In one embodiment, a fastening structure for fastening a fastened object is provided. The fastening structure includes a bracket, a fastener, and a base member. The bracket comprises a bracket stage, a bracket hole, and a bracket recess, the bracket hole is formed on the bracket stage. The fastened object is adapted to abut the bracket stage. At least a portion of the base member is moveably inserted into the bracket recess. The base member comprises a member fastening hole. The fastener passes through the fastened object and the bracket hole to connect to the member fastening hole of the base member.

In one embodiment, the material of the base member comprises polyphenylene sulfide (PPS), polyamide (PA) or metal, and the material of the bracket comprises polycarbonate (PC), acrylonitrile butadiene styrene (ABS), or a combination of polycarbonate (PC) and acrylonitrile butadiene styrene (ABS).

In the electronic device of the embodiment of the invention, the member fastening hole is formed on the base member, and the fastener (for example, a bolt) is connected to the member fastening hole to affix the fastened object (for example, a circuit board). When the member fastening hole is broken, the base member can be replaced without having to change the whole housing. In one embodiment, since the base member is made of a material that has high environmental stress cracking resistance, or it is made of metal, the improved fastening reliability can be achieved at a lower cost.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
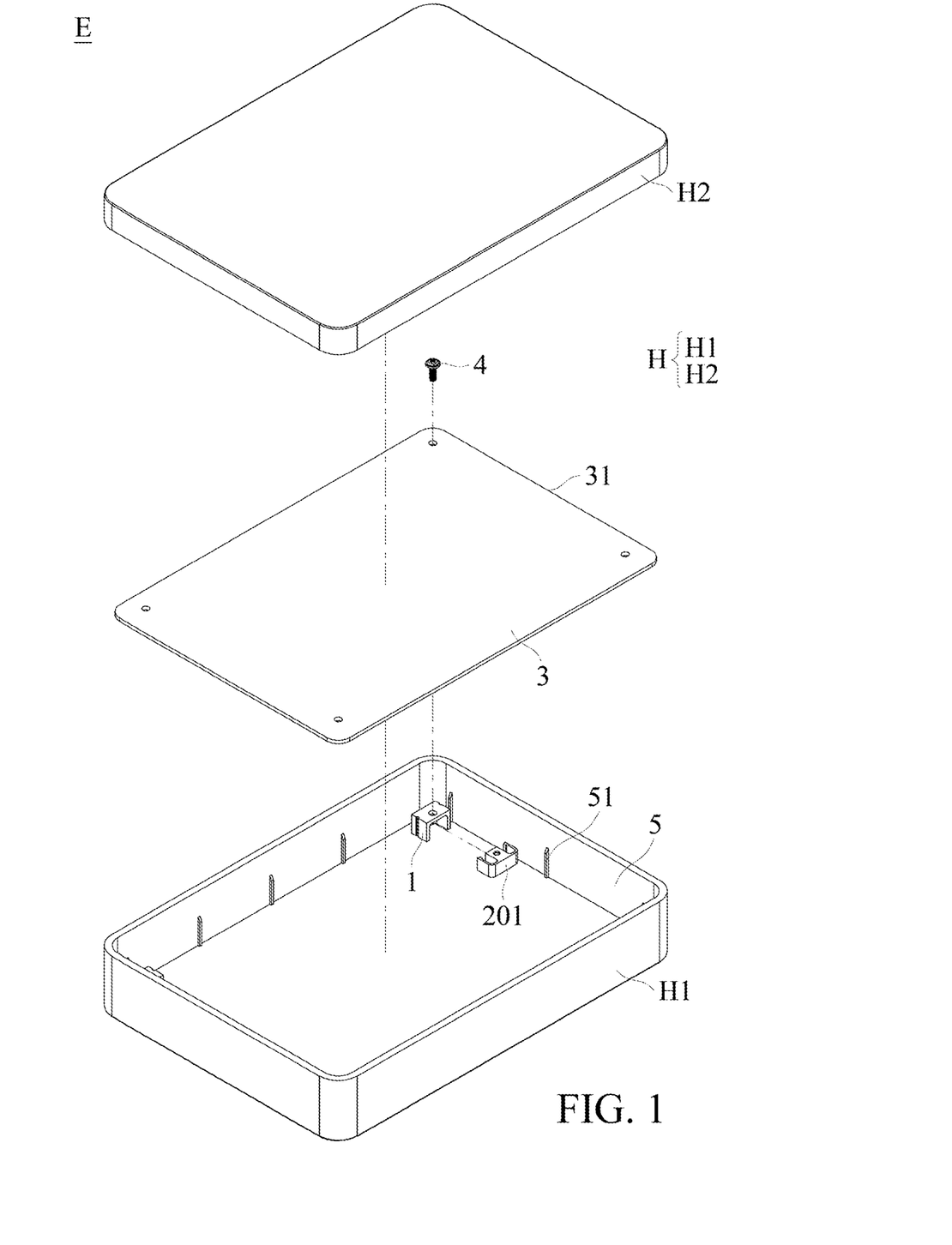
FIG. 1 is an exploded view of an electronic device of an embodiment of the invention.

FIG. 1 is an exploded view of an electronic device of an embodiment of the invention. With reference to FIG. 1, the electronic device E of the embodiment of the invention includes a housing H, a fastened object 3, a fastener 4 and a base member 201. The housing H includes a housing body H1 and a bracket 1. The bracket 1 is integrally formed on the housing body H1. In this embodiment, the housing H further comprises a cover H2, and the cover H2 is combined to the housing body H1.

Figure 2A:
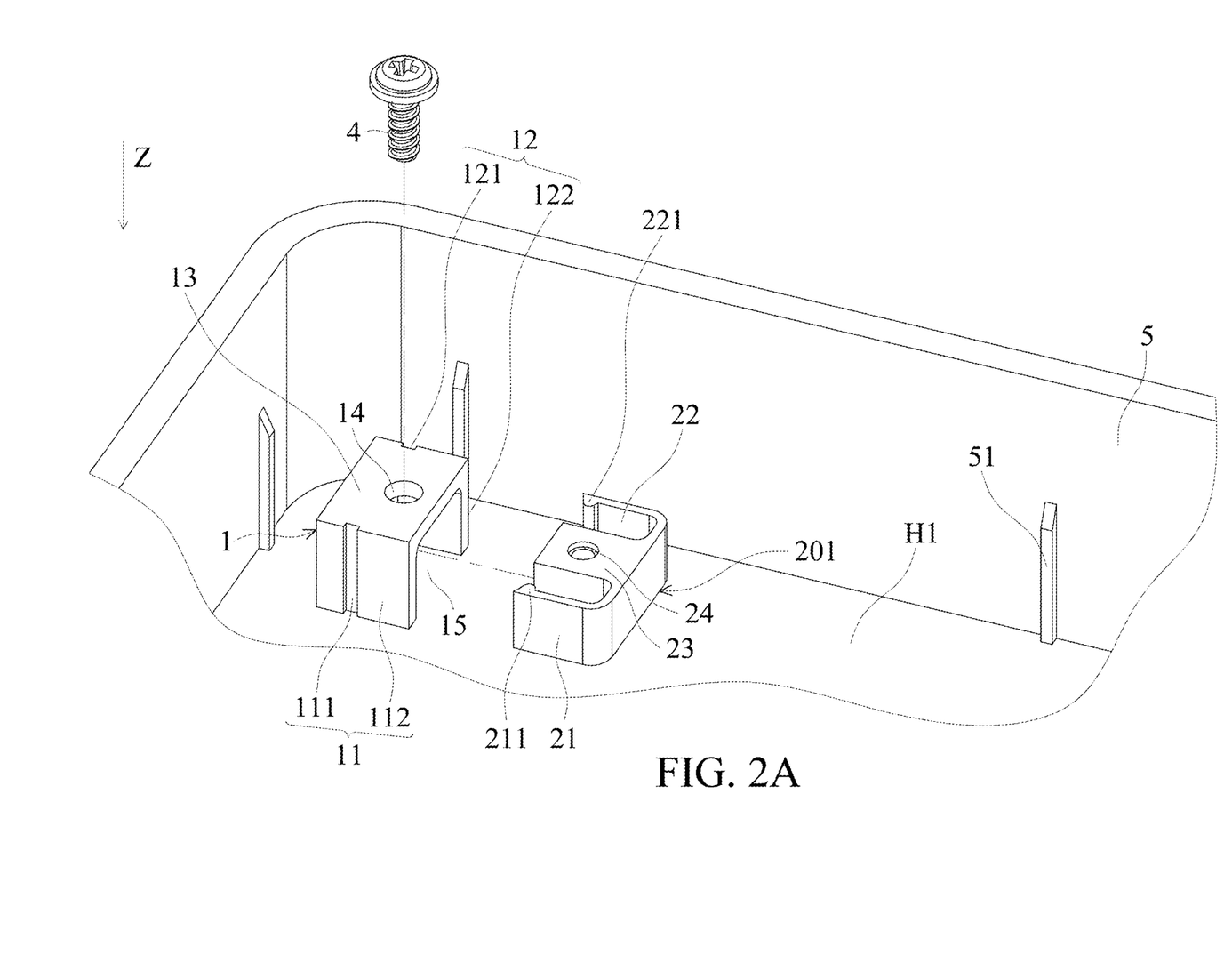
FIG. 2A is an exploded view of a bracket and a base member of the first embodiment of the invention.
Figure 2B:
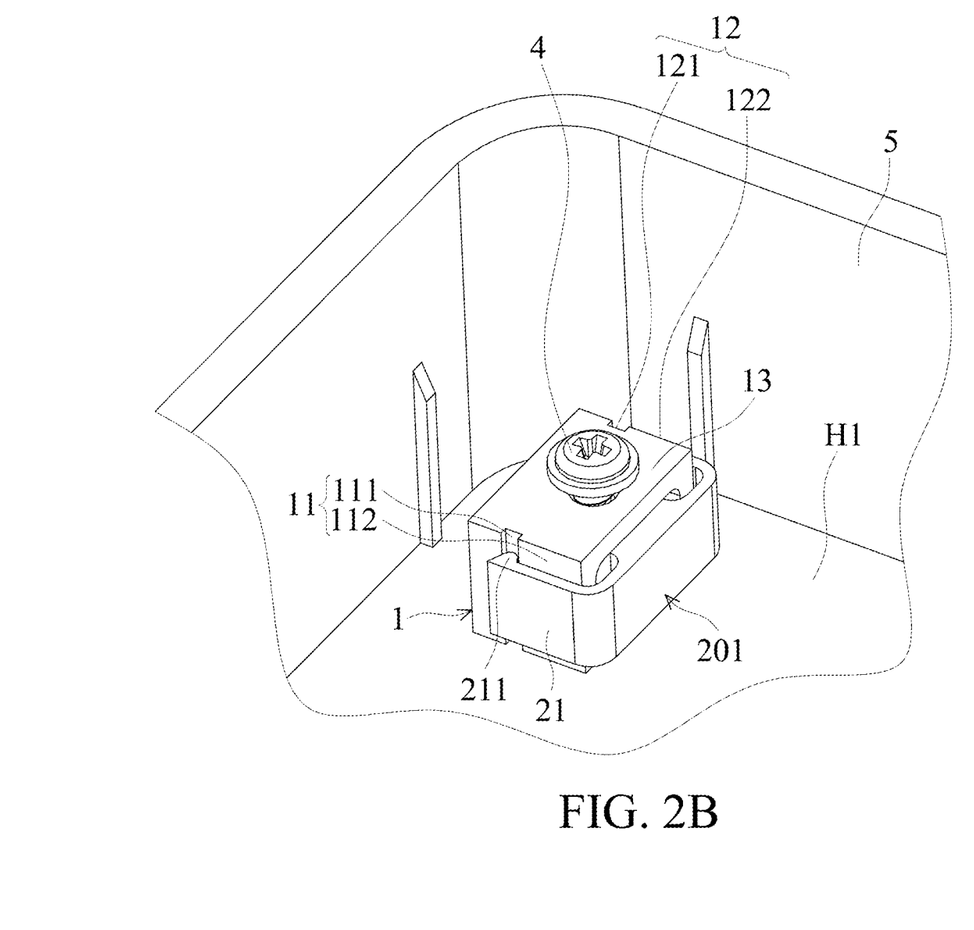
FIG. 2B is an assembled view of the bracket and the base member of the first embodiment of the invention.

FIG. 2A is an exploded view of the bracket and the base member of the first embodiment of the invention. FIG. 2B is an assembled view of the bracket and the base member of the first embodiment of the invention. With reference to FIGS. 1, 2A and 2B, the bracket 1 comprises a bracket stage 13, a bracket hole 14 and a bracket recess 15. The bracket hole 14 is formed on the bracket stage 13. The fastened object 3 corresponds to the bracket stage 13. At least a portion of the base member 201 is moveably inserted into the bracket recess 15. The base member 201 comprises a member fastening hole 24. The fastener 4 passes through the fastened object 3 and the bracket hole 14 to connect to the member fastening hole 24 of the base member 201.

With reference to FIGS. 1, 2A and 2B, in one embodiment, the fastener 4 can be a bolt or other fastener.

In one embodiment, the material of the base member 201 and the bracket 1 can be made of the same material. In another embodiment, the material or the structural thickness of the base member 201 can be different from the material of the bracket 1 to improve the environmental stress cracking resistance (ESCR) thereof. With reference to FIGS. 1, 2A and 2B, in one embodiment, the environmental stress cracking resistance of the material of the base member 201 is greater than the environmental stress cracking resistance of the material of the bracket 1. In one embodiment, the material of the base member comprises polyphenylene sulfide (PPS) or polyamide (PA). The material of the bracket comprises polycarbonate (PC), acrylonitrile butadiene styrene (ABS), or a combination of polycarbonate (PC) and acrylonitrile butadiene styrene (ABS). Generally speaking, the material of the bracket is conducive to injection molding, and the material of the base member has improved environmental stress cracking resistance.

With reference to FIGS. 2A and 2B, in one embodiment, the bracket 1 comprises a first sidewall 11 and a second sidewall 12. One end of the first sidewall 11 is connected to the housing body H1, and the other end of the first sidewall 11 is connected to the bracket stage 13. One end of the second sidewall 12 is connected to the housing body H1, the other end of the second sidewall 12 is connected to the bracket stage 13. The bracket recess 15 is formed between the first sidewall 11 and the second sidewall 12.

With reference to FIGS. 2A and 2B, in one embodiment, the bracket 1 comprises a first bracket wedging portion 111 and a second bracket wedging portion 121. The first bracket wedging portion 111 is formed on a first outer surface 112 of the first sidewall 11. The second bracket wedging portion 121 is formed on a second outer surface 122 of the second sidewall 12. The base member 201 comprises a first member wedging portion 211 and a second member wedging portion 221. The first member wedging portion 211 is wedged into the first bracket wedging portion 111, and the second member wedging portion 221 is wedged into the second bracket wedging portion 121. The base member 201 is therefore sufficiently combined with the bracket 1, and the user can fasten the fastener 4 easily.

With reference to FIGS. 2A and 2B, in one embodiment, the base member 201 comprises a member body 23, a first arm 21 and a second arm 22. The first arm 21 is formed on one side of the member body 23. The second arm 22 is formed on another side of the member body 23. The first member wedging portion 211 is formed on a free end of the first arm 21. The second member wedging portion 221 is formed on a free end of the second arm 22. The member fastening hole 24 is formed on the member body 23. Utilizing the first arm 21, the first member wedging portion 211 is elastically wedged into the first bracket wedging portion 111. Utilizing the second arm 22, the second member wedging portion 221 is elastically wedged into the second bracket wedging portion 121.

With reference to FIG. 2A and 2B, in one embodiment, the member body 23 is inserted into the bracket recess 15. A portion of the first sidewall 11 is located between the first arm 21 and the member body 23. A portion of the second sidewall 12 is located between the second arm 22 and the member body 23.

With reference to FIG. 2A and 2B, in one embodiment, the first bracket wedging portion 111 and the second bracket wedging portion 121 are wedging slots. The first bracket wedging portion 111 and the second bracket wedging portion 121 extend in a first direction Z. The fastener 4 passes through the fastened object and the bracket hole 14 in the first direction Z to connect to the member fastening hole 24 of the base member 201. The first member wedging portion 211 and the second member wedging portion 221 are wedging protrusions.

With reference to FIGS. 1, 2A and 2B, in one embodiment, the fastened object 3 is a circuit board, and the fastened object 3 abuts the bracket stage 13. However, the disclosure is not meant to restrict the invention. For example, in another embodiment, the fastened object 3 can be cover or other object.

With reference to FIGS. 1, 2A and 2B, in one embodiment, the electronic device E further comprises at least one restriction element 51. The housing body H1 comprises a housing sidewall 5. The restriction element 51 is disposed on the edge 31 of the fastened object (circuit board) 3 and the housing sidewall 5. In one embodiment, the restriction element 51 is a restriction rib. The restriction element 51 is integrally formed on the housing sidewall 5 to laterally restrict the fastened object 3. In another embodiment, the restriction element 51 can be made of buffer material, such as rubber or sponge.

Figure 3:
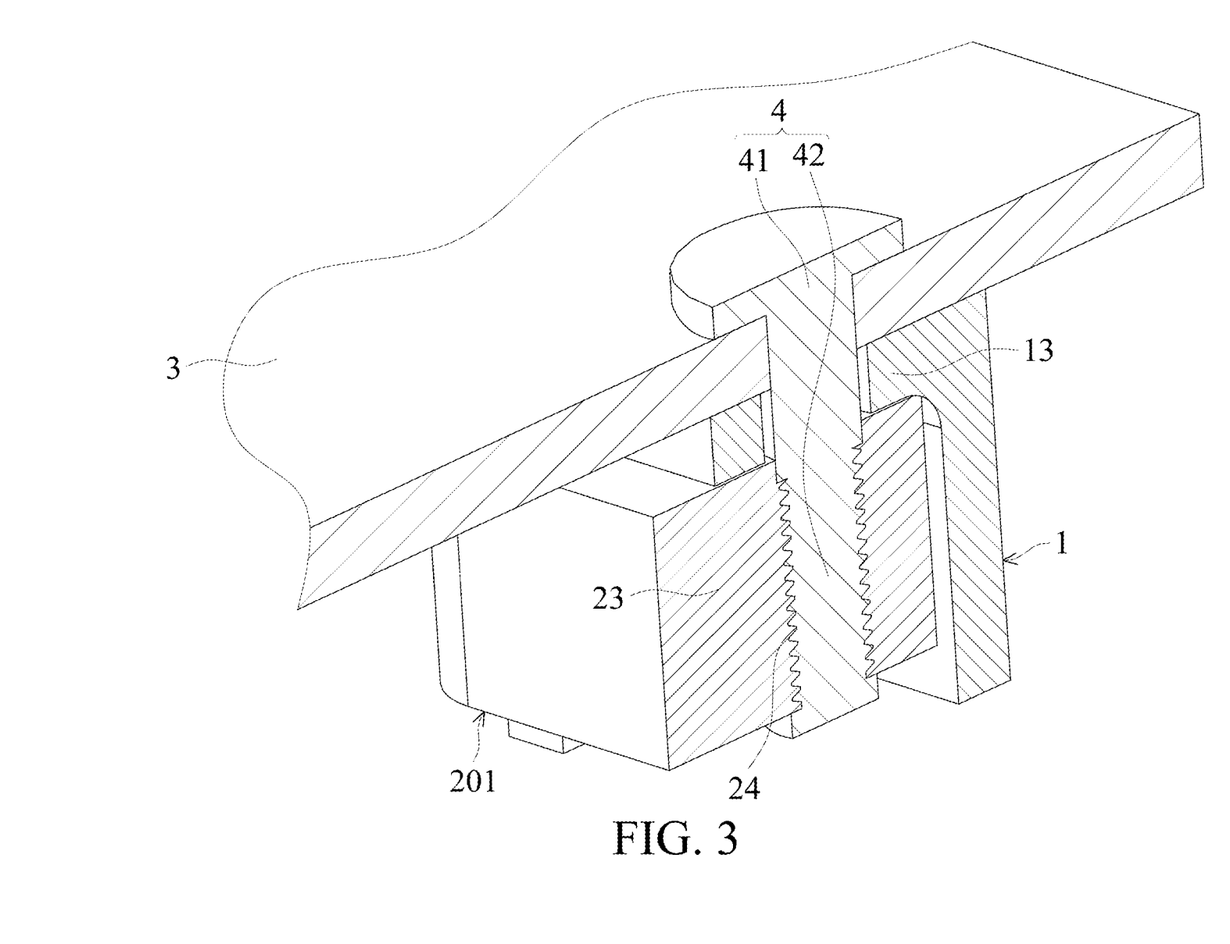
FIG. 3 is a cross sectional view of a fastening structure of the first embodiment of the invention.

FIG. 3 is a cross sectional view of a fastening structure of the first embodiment of the invention. With reference to FIGS. 1 and 3, a bolt head 41 of the fastener 4 abuts the fastened object 3. A thread section 42 of the fastener 4 is connected to the member fastening hole 24. The fastened object 3 and the bracket 13 are sandwiched between the bolt head 41 and the member body 23. When the electronic device E receives a lateral impact, the impact is transformed to the restriction element 51 and the housing sidewall 5 via the fastener 4, and the influence of the shear force applied to the fastener 4 is reduced.

Figure 4:
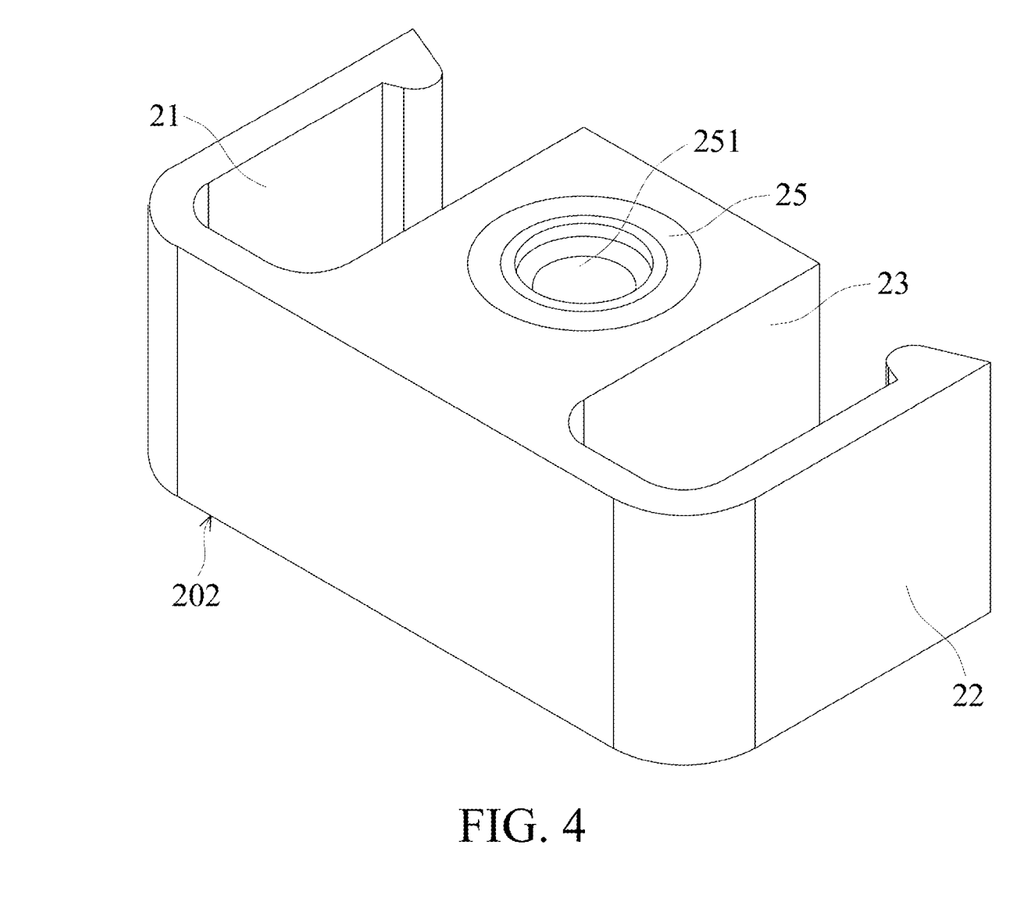
FIG. 4 shows a base member of a second embodiment of the invention.

FIG. 4 shows a base member of a second embodiment of the invention. With reference to FIG. 4, the base member 202 of the second embodiment of the invention comprises a metal nut 25. The metal nut 25 is embedded in the member body 23. The member fastening hole 251 is formed in the metal nut 25. In this embodiment, the metal nut 25 further improves the environmental stress cracking resistance of the base member.

Figure 5A:
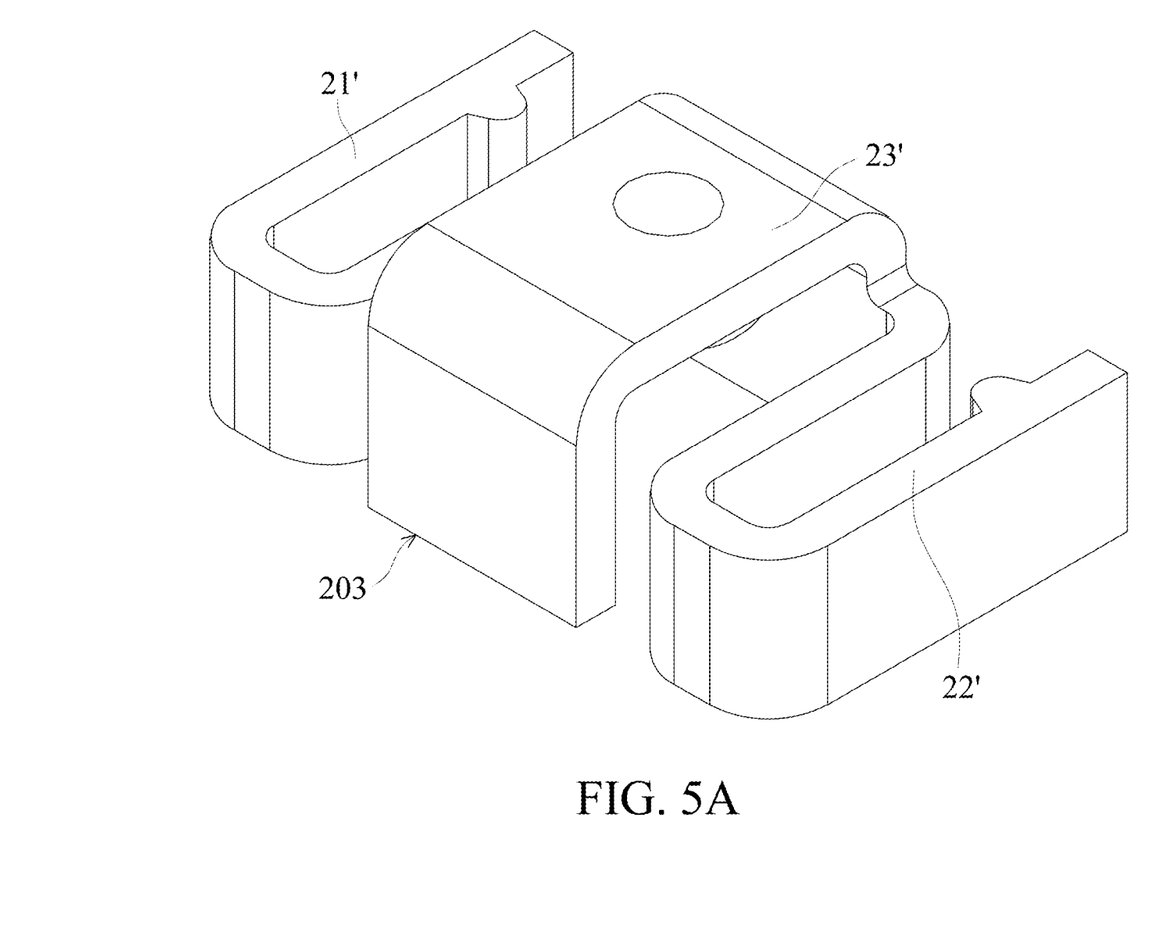
FIG. 5A shows a base member of a third embodiment of the invention.
Figure 5B:
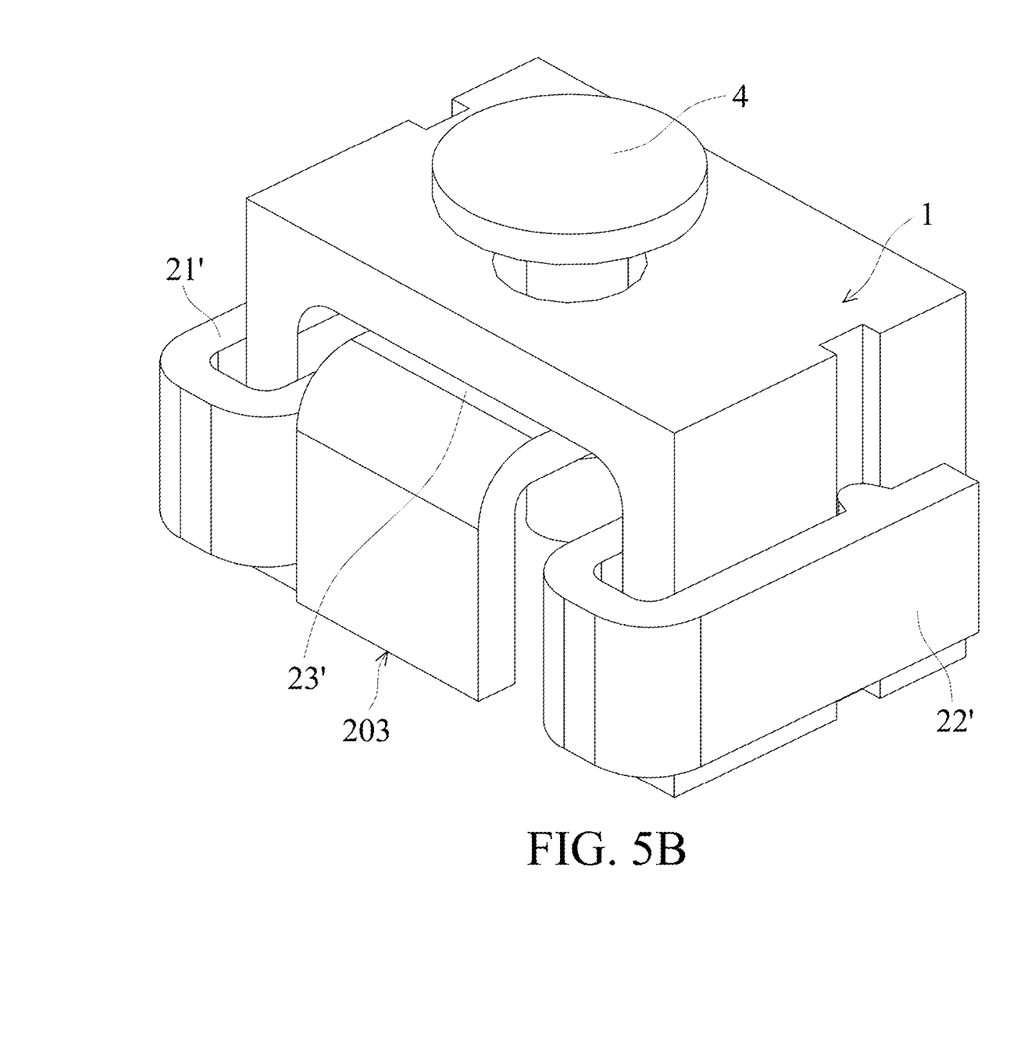
FIG. 5B shows the base member combined to the bracket of the third embodiment of the invention.

FIG. 5A shows a base member of a third embodiment of the invention. FIG. 5B shows the base member combined to the bracket of the third embodiment of the invention. With reference to FIGS. 5A and 5B, the base member 203 is a metal member, which comprises a member body 23', a first arm 21' and a second arm 22'. In one embodiment, the base member 203 is formed by punching. In other words, the material of the base member can also be metal to improve the stress resistance.

In the electronic device of the embodiment of the invention, the member fastening hole is formed on the base member, and the fastener (for example, a bolt) is connected to the member fastening hole to affix the fastened object (for example, a circuit board). When the member fastening hole is broken, the base member can be replaced without having to change the whole housing. In one embodiment, since the base member is made of material of high environmental stress cracking resistance or made of metal, the improved fastening reliability is achieved with lower cost.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a housing, comprising a housing body and a bracket, wherein the bracket is integrally formed on the housing body, the bracket comprises a bracket stage, a bracket hole and a bracket recess, and the bracket hole is formed on the bracket stage, wherein the bracket hole is an enclosed opening;
   a fastened object, corresponding to the bracket stage;
   a fastener; and
   a base member, wherein at least a portion of the base member is moveably inserted into the bracket recess, the base member comprises a member fastening hole, the fastener passes through the fastened object and the bracket hole to connect to the member fastening hole of the base member.

2. The electronic device as claimed in claim 1, wherein the fastener is a bolt.

3. The electronic device as claimed in claim 1, wherein an environmental stress cracking resistance of a material of the base member is greater than an environmental stress cracking resistance of a material of the bracket.

4. The electronic device as claimed in claim 1, wherein the material of the base member comprises polyphenylene sulfide (PPS), polyamide (PA) or metal.

5. The electronic device as claimed in claim 1, wherein the bracket comprises a bracket wedging portion, the base member comprises a member wedging portion, and the bracket wedging portion is adapted to be wedged into the member wedging portion.

6. The electronic device as claimed in claim 1, wherein the bracket comprises a first sidewall and a second sidewall, one end of the first sidewall is connected to the housing body, the other end of the first sidewall is connected to the bracket stage, one end of the second sidewall is connected to the housing body, the other end of the second sidewall is connected to the bracket stage, and the bracket recess is formed between the first sidewall and the second sidewall.

7. The electronic device as claimed in claim 6, wherein the bracket comprises a first bracket wedging portion and a second bracket wedging portion, the first bracket wedging portion is formed on a first outer surface of the first sidewall, the second bracket wedging portion is formed on a second outer surface of the second sidewall, the base member comprises a first member wedging portion and a second member wedging portion, the first member wedging portion is wedged into the first bracket wedging portion, and the second member wedging portion is wedged into the second bracket wedging portion.

8. The electronic device as claimed in claim 7, wherein the base member comprises a member body, a first arm and a second arm, the first arm is formed on one side of the member body, the second arm is formed on another side of the member body, the first member wedging portion is formed on a free end of the first arm, the second member wedging portion is formed on a free end of the second arm, and the member fastening hole is formed on the member body.

9. The electronic device as claimed in claim 8, wherein the member body is inserted into the bracket recess, a portion of the first sidewall is located between the first arm and the member body, and a portion of the second sidewall is located between the second arm and the member body.

10. The electronic device as claimed in claim 8, wherein the first bracket wedging portion and the second bracket wedging portion are wedging slots, the first bracket wedging portion and the second bracket wedging portion extend in a first direction, the fastener passes through the fastened object and the bracket hole in the first direction to connect to the member fastening hole of the base member, and the first member wedging portion and the second member wedging portion are wedging protrusions.

11. The electronic device as claimed in claim 8, wherein the base member comprises a metal nut, the metal nut is embedded in the member body, and the member fastening hole is formed in the metal nut.

12. The electronic device as claimed in claim 1, wherein the fastened object is a circuit board, and the fastened object abuts the bracket stage.

13. The electronic device as claimed in claim 12, further comprising at least one restriction element, wherein the housing body comprises a housing sidewall, and the restriction element is disposed on an edge of the circuit board and the housing sidewall.

14. A fastening structure, for fastening a fastened object, comprising:
  a bracket, comprising a bracket stage, a bracket hole and a bracket recess, wherein the bracket hole is formed on the bracket stage, and the fastened object is adapted to abut the bracket stage, wherein the bracket hole is an enclosed opening;
  a fastener; and
  a base member, wherein at least a portion of the base member is moveably inserted into the bracket recess, the base member comprises a member fastening hole, the fastener passes through the fastened object and the bracket hole to connect to the member fastening hole of the base member.

15. The fastening structure as claimed in claim 14, wherein the environmental stress cracking resistance of the material of the base member is greater than the environmental stress cracking resistance of the material of the bracket.

16. The fastening structure as claimed in claim 14, wherein the material of the base member comprises polyphenylene sulfide (PPS), polyamide (PA) or metal, and the material of the bracket comprises polycarbonate (PC), acrylonitrile butadiene styrene (ABS), or a combination of polycarbonate (PC) and acrylonitrile butadiene styrene (ABS).

17. The fastening structure as claimed in claim 14, wherein the bracket comprises a first sidewall and a second sidewall, one end of the first sidewall is connected to the housing body, the other end of the first sidewall is connected to the bracket stage, one end of the second sidewall is connected to the housing body, the other end of the second sidewall is connected to the bracket stage, and the bracket recess is formed between the first sidewall and the second sidewall.

18. The fastening structure as claimed in claim 17, wherein the bracket comprises a first bracket wedging portion and a second bracket wedging portion, the first bracket wedging portion is formed on a first outer surface of the first sidewall, the second bracket wedging portion is formed on a second outer surface of the second sidewall, the base member comprises a first member wedging portion and a second member wedging portion, the first member wedging portion is wedged into the first bracket wedging portion, and the second member wedging portion is wedged into the second bracket wedging portion.

19. The fastening structure as claimed in claim 18, wherein the base member comprises a member body, a first arm and a second arm, the first arm is formed on one side of the member body, the second arm is formed on another side of the member body, the first member wedging portion is formed on a free end of the first arm, the second member wedging portion is formed on a free end of the second arm, and the member fastening hole is formed on the member body.

20. The fastening structure as claimed in claim 19, wherein the member body is inserted into the bracket recess, a portion of the first sidewall is located between the first arm and the member body, a portion of the second sidewall is located between the second arm and the member body, the first bracket wedging portion and the second bracket wedging portion are wedging slots, the first bracket wedging portion and the second bracket wedging portion extend in a first direction, the fastener passes through the fastened object and the bracket hole in the first direction to connect to the member fastening hole of the base member, and the first member wedging portion and the second member wedging portion are wedging protrusions.

* * * * *